United States Patent [19]
Herzberger et al.

[11] Patent Number: 5,798,908
[45] Date of Patent: Aug. 25, 1998

[54] ELECTRONIC ASSEMBLY WITH A HEAT SINK, IN PARTICULAR FOR THE HIGH VOLTAGE TRANSFORMER FOR THE DISCHARGE LAMP OF A MOTOR VEHICLE HEADLIGHT

[75] Inventors: Erick Herzberger, Gagny; Jean-Marc Nicolai, Courbevoie; Bruno Cassese, Creteil; Patrick Wacheux, Villejuif, all of France

[73] Assignee: Valeo Electronique, Creteil, France

[21] Appl. No.: 763,803

[22] Filed: Dec. 11, 1996

[30] Foreign Application Priority Data

Dec. 11, 1995 [FR] France .................. 95 14647

[51] Int. Cl.⁶ .................................. H05K 7/20
[52] U.S. Cl. .................. 361/707; 174/252; 361/719; 361/720
[58] Field of Search .................. 165/86.2, 86.3, 165/185; 174/16.3, 252; 257/706–707, 712–713; 361/704, 707, 717–721

[56] References Cited

U.S. PATENT DOCUMENTS

| | | | |
|---|---|---|---|
| 4,974,119 | 11/1990 | Martin . | |
| 4,979,074 | 12/1990 | Murley et al. | 361/720 |
| 5,196,990 | 3/1993 | Kurosaki | 361/720 |
| 5,276,584 | 1/1994 | Collins et al. | 174/16.3 |
| 5,523,919 | 6/1996 | Canova | 361/720 |
| 5,703,752 | 12/1997 | Woo | 361/720 |

FOREIGN PATENT DOCUMENTS

| | | |
|---|---|---|
| 29 19 058 | 11/1980 | Germany . |
| 39 32 213 | 4/1991 | Germany . |
| 41 34 101 | 4/1992 | Germany . |
| 42 40 996 | 6/1994 | Germany . |

Primary Examiner—Gregory D. Thompson
Attorney, Agent, or Firm—McCormick, Paulding & Huber

[57] ABSTRACT

An electronic assembly comprising a heat sink and a double-sided printed circuit card assembled to the heat sink by hot pressing. The card carries a plurality of surface-mounting components on its face remote from the heat sink. Further, the card carries at least one through component and the heat sink has a void over the zone of the printed circuit card which receives the through component. The ends of the pins of the component are bonded to the card inside the void.

9 Claims, 1 Drawing Sheet

ELECTRONIC ASSEMBLY WITH A HEAT SINK, IN PARTICULAR FOR THE HIGH VOLTAGE TRANSFORMER FOR THE DISCHARGE LAMP OF A MOTOR VEHICLE HEADLIGHT

The present invention relates to an electronic assembly having a heat sink, in particular for the high voltage transformer for a motor vehicle discharge lamp.

BACKGROUND OF THE INVENTION

Electronic assembly structures including a heat sink are already known. Reference may be made in this respect to DE 42 40 996 and DE 39 32 213.

An electronic assembly structure having a heat sink and of a type known in the prior art is shown in FIG. 1.

It comprises a printed circuit card 1 whose substrate is constituted, for example, by an epoxy material reinforced by glass fibers and carrying electrically conductive tracks on both of its faces.

This double-sided card 1 is assembled on a heat sink 2 by hot pressing. During the hot-pressing operation, the tracks on the face of the card 1 that faces the heat sink 2 directly are bonded to said heat sink 2 by melting.

The heat sink 2 may, for example, be an aluminum plate that is covered in a layer 2a of electrical insulation which serves to insulate the conductive tracks electrically from said plate after hot pressing.

Surface-mounting components (SMCs) 3 are flow soldered to the other face of the card 1.

Such an assembly structure is not suitable for use with through-type components, as is generally the case of a high voltage transformer that powers a discharge lamp.

Conventionally, such a transformer has six through pins which serve to hold it mechanically on the printed circuit card and whose ends are soldered to the face of the card opposite from its face on which the transformer is mounted.

Consequently, that assembly structure makes it necessary to replace through-type components with special SMCs, which are more expensive than conventional through-type components, particularly in the case of high voltage transformers.

OBJECTS AND SUMMARY OF THE INVENTION

An object of the invention is to provide an assembly structure enabling that drawback to be mitigated.

The assembly structure described above with reference to FIG. 1 also makes it impossible to take advantage of all of the possibilities offered by the two-sided nature of the cards 1, since only one of the faces of cards 1 can receive SMCs.

Another object of the invention is therefore to propose an electronic assembly structure having a heat sink that enables both faces of the printed circuit card to receive SMCs.

More particularly, the invention provides an electronic assembly comprising a heat sink and a double-sided printed circuit card assembled to said heat sink by hot pressing, said card carrying a plurality of surface-mounting components on its face remote from said heat sink, wherein said card also carries at least one through component, the heat sink having a void over the zone of the printed circuit card that receives the through component, the ends of the pins of said component being bonded to said card inside said void.

The invention also provides a method of making such an assembly.

BRIEF DESCRIPTION OF THE DRAWING

Other characteristics and advantages of the invention appear further from the following description. The description is purely illustrative and non-limiting. It should be read with reference to the accompanying drawing, in which.

MORE DETAILED DESCRIPTION

Figure 2:
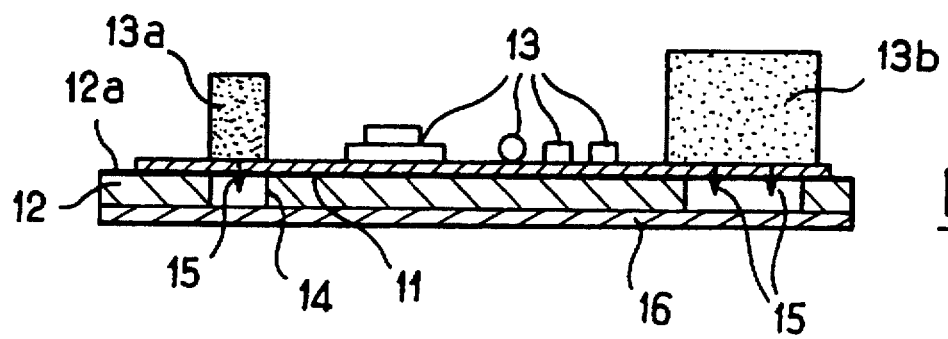
FIGS. 2 and 3 are section views showing two possible embodiments of the assembly structure of the invention.

The assembly shown in FIG. 2 comprises a double-sided printed circuit card 11 assembled by hot pressing onto a heat sink 12, together with surface-mounting components 13 and through-mounting components 13a and 13b applied to the face of the card 11 remove from the heat sink 12.

Figure 1:
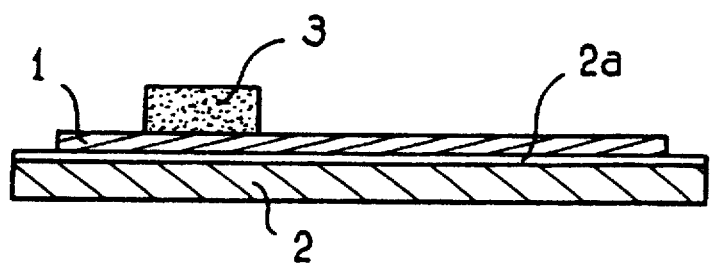
FIG. 1, described above, is a section view through a prior art assembly structure.

The card 11 and the heat sink 12 are similar to the card 1 and the heat sink 2 of the assembly described with reference to FIG. 1. In particular, the heat sink 12 is a metal substrate, e.g. made of aluminum, covered in a layer 12a of electrical insulation.

The heat sink 12 differs from the heat sink 2 in that its substrate has a plurality of voids 14 situated in register with those zones of the card 11 that are designed to receive the through components 13a and 13b.

The ends of the pins 15 of the through components 13a and 13b are soldered inside the voids 14 to the face of the printed circuit card 11 which is in contact with the heat sink 12.

A metal plate 16 is applied to the face of the heat sink 12 that is remote from the card 11. This plate 16 seals the assembly. In order to ensure good thermal coupling with the heat sink 12, its face that is in contact with said heat sink 12 presents a surface of high quality.

Such a structure is made as follows.

The voids 14 may be made, for example, by machining through the metal substrate of the heat sink 12.

The printed circuit card 11 is then applied to the heat sink 12 and is fixed thereto by hot pressing. Thereafter, the SMCs 13 are fixed by flow soldering to the printed circuit on the face of the card 11 remote from the heat sink 12.

Once this operation has been completed, the through components 13a and 13b are fixed to the card 11 by having the ends of their pins 15 bonded by arc welding or by soldering iron to the portions of printed circuit on the card 11 in the voids 14.

Where appropriate, other SMCs are bonded to the same face of the card 11 as the pins 15 by flow soldering or by reflow soldering.

Figure 3:
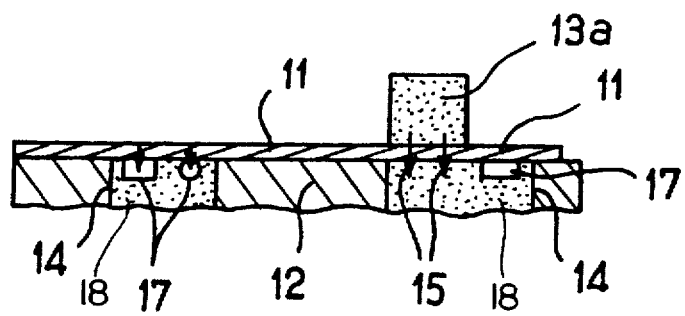

This is shown in FIG. 3 in which there can be seen a variant embodiment having SMCs 17 soldered inside voids 14 to the card 11, on the same side as the ends of the pins 15.

Naturally, that requires voids 14 that are large enough to be capable of receiving such SMCs and of enabling flow soldering to be performed, where appropriate.

In this variant, the assembly is sealed not by a metal plate applied to the heat sink 12, but by insulating resin 18 cast into the voids 14.

Figure 4:
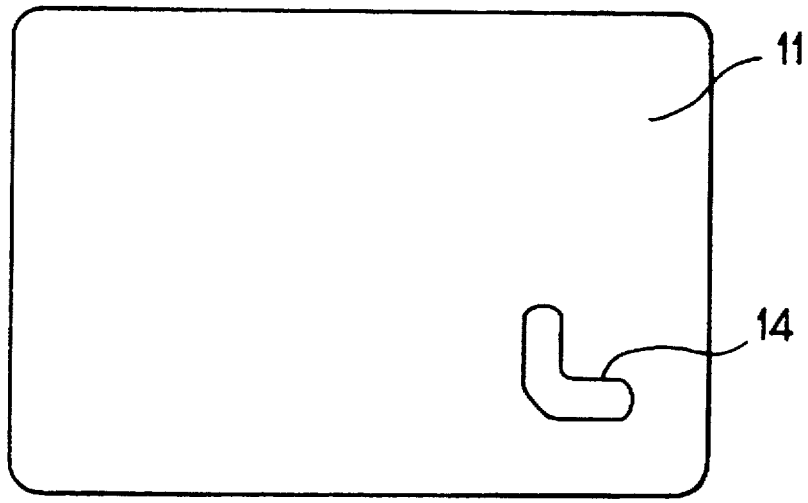
FIG. 4 is a plan view showing an example of a possible shape for the voids in the heat sink.

FIG. 4 shows one example of a shape for a void.

The void 14 shown in this figure is L-shaped, which corresponds to a particular disposition of the pins of a high voltage transformer.

Naturally, this shape will vary depending on the disposition of the pins of the through component.

It is selected so as to minimize the area occupied by the voids in the heat sink 12 and to maximize the area of the heat sink 12 which can be used for radiating heat. This option also makes it possible to limit the volume of insulating resin required for filling the voids 14. Such resin is expensive.

We claim:

1. An electronic assembly comprising a heat sink and a double-sided printed circuit card assembled to said heat sink by hot pressing, said card carrying a plurality of surface-mounting components on its face remote from said heat sink, wherein said card also carries at least one through component, the heat sink having a void over the zone of the printed circuit card that receives the through component, the ends of the pins of said component being bonded to said card inside said void.

2. An electronic assembly according to claim 1, wherein the printed circuit card carries at least one surface-mounting component inside the void.

3. An electronic assembly according to claim 1, wherein the void of the heat sink is filled with an insulating resin.

4. An electronic assembly according to claim 1, wherein a metal sealing plate is applied to the face of the heat sink remote from the printed circuit card.

5. An electronic assembly according to claim 1, wherein the through component is a high density transformer, in particular for a motor vehicle discharge lamp.

6. A method of making an electronic assembly according to claim 1, comprising the following various steps:

the double-sided printed circuit card is hot-pressed to the heat sink having the void;

surface-mounting components are bonded to the face of said card remote from the heat sink by flow soldering or by reflow soldering; and the pins of the through component are bonded to the card inside the void by arc welding or by a soldering iron.

7. A method according to claim 6, wherein at least one other surface-mounting component is flow soldered inside the void.

8. A method according to claim 6, wherein the void is subsequently filled with an insulating resin.

9. A method according to claim 6, wherein a metal sealing plate is applied to the face of the heat sink remote from the card.

* * * * *